(12) United States Patent
Yamabi et al.

(10) Patent No.: US 7,332,758 B2
(45) Date of Patent: Feb. 19, 2008

(54) SEMICONDUCTOR DEVICE

(75) Inventors: Ryuji Yamabi, Yamanashi (JP); Hiroshi Yano, Yamanashi (JP)

(73) Assignee: Eudyna Devices Inc., Yamanashi (JP)

( * ) Notice: Subject to any disclaimer, the term of this patent is extended or adjusted under 35 U.S.C. 154(b) by 0 days.

(21) Appl. No.: 11/642,896

(22) Filed: Dec. 21, 2006

(65) Prior Publication Data

US 2007/0145527 A1 Jun. 28, 2007

(30) Foreign Application Priority Data

Dec. 28, 2005 (JP) ............... 2005-379661

(51) Int. Cl.
*H01L 31/062* (2006.01)
*H01L 31/113* (2006.01)
(52) U.S. Cl. ...................... 257/292; 257/532
(58) Field of Classification Search ........ 257/292–293, 257/530–535
See application file for complete search history.

(56) References Cited

U.S. PATENT DOCUMENTS

2006/0157761 A1* 7/2006 Park et al. .................. 257/293

2007/0012955 A1* 1/2007 Ihama ........................ 257/233
2007/0131991 A1* 6/2007 Sugawa ...................... 257/292

FOREIGN PATENT DOCUMENTS

JP 2005-129689 A 5/2005

* cited by examiner

*Primary Examiner*—Cuong Nguyen
(74) *Attorney, Agent, or Firm*—Westerman, Hattori, Daniels & Adrian, LLP.

(57) ABSTRACT

A semiconductor device has an electrode pad, a capacitor and a substrate. The substrate has a given area on which the electrode pad and the capacitor are arranged. The electrode pad and the capacitor are arranged on the substrate so that each of at least two sides of the capacitor and each of at least two sides of the electrode pad is adjacent to each other at a given interval. The capacitor has a connecting side that connects the two sides of the capacitor and faces to the electrode pad. Outside angles of the capacitor formed by the connecting side and the two sides of the capacitor are more than 90 degrees.

6 Claims, 10 Drawing Sheets

SEMICONDUCTOR DEVICE

BACKGROUND OF THE INVENTION

1. Field of the Invention

This invention generally relates to a semiconductor device having an electrode pad and a capacitor.

2. Description of the Related Art

Japanese Patent Application Publication No. 2005-129689 (hereinafter referred to as Document 1) discloses a semiconductor light-receiving element having a structure in which a photodiode, a resistor, a bypass diode and a capacitor are integrated on an InP substrate. In the structure disclosed in Document 1, it is possible to integrate elements necessary for acting as a light-receiving element on the InP substrate. And outside parts such as a resistor and a capacitor are not necessary.

Here, the capacitor is used for filtering out high-frequency-wave component generated in an electric power supply and for restraining a malfunction of a device. The high-frequency-wave signal of the high-frequency-wave component transmits in a power supply line as a current changes, and triggers the malfunction of the device. Therefore, a large capacitance capacitor sufficiently filtering out the high-frequency-wave component is necessary.

However, in the structure disclosed in Document 1, it is necessary to enlarge the semiconductor light-receiving device if the capacitance of the capacitor is increased sufficiently.

SUMMARY OF THE INVENTION

The present invention provides a semiconductor device where a capacitance of a capacitor can be enlarged without an enlargement of the semiconductor device.

According to an aspect of the present invention, preferably, there is provided a semiconductor device including an electrode pad, a capacitor and a substrate. The substrate has a given area on which the electrode pad and the capacitor are arranged. The electrode pad and the capacitor are arranged on the substrate so that each of at least two sides of the capacitor and each of at least two sides of the electrode pad are adjacent to each other at a given interval. The capacitor has a connecting side that connects the two sides of the capacitor and that faces to the electrode pad. Outside angles of the capacitor formed by the connecting side and the two sides of the capacitor are more than 90 degrees.

With the above-mentioned configuration, it is possible to enlarge a part of the capacitor adjacent to the electrode pad toward the electrode pad. It is, therefore, possible to enlarge the area of the capacitor. And it is possible to enlarge the capacitance of the capacitor without an enlargement of the semiconductor device.

According to another aspect of the present invention, preferably, there is provided a semiconductor device including an electrode pad, a capacitor and a substrate. The substrate has a given area on which the electrode and the capacitor are arranged. The capacitor has a connecting side that connects outer sides of the capacitor crossing at substantially right angles and that forms interior angles of more than 90 degrees with the outer sides. The capacitor and the electrode pad are arranged on the substrate so that the electrode pad faces to the connecting side in a part of an inner area laid out by extensions of the outer sides of the capacitor.

With the above-mentioned configuration, it is possible to enlarge a part of the capacitor adjacent to the electrode pad toward the electrode pad. It is, therefore, possible to enlarge the area of the capacitor. And it is possible to enlarge the capacitance of the capacitor without an enlargement of the semiconductor device.

According to another aspect of the present invention, preferably, there is provided a semiconductor device including an electrode pad, a capacitor and a substrate. The substrate has a given area on which the electrode and the capacitor are arranged. The electrode pad and the capacitor are arranged on the substrate so that each of at least two sides of the capacitor and each of at least two sides of the electrode pad are adjacent to each other at a given interval. The capacitor has a connecting side that connects the two sides of the capacitor and that faces to an inner corner formed by extensions of outer sides of the capacitor crossing at substantially right angles. The connecting side is concave toward the capacitor.

With the above-mentioned configuration, it is possible to enlarge a part of the capacitor adjacent to the electrode pad toward the electrode pad. It is, therefore, possible to enlarge the area of the capacitor. And it is possible to enlarge the capacitance of the capacitor without an enlargement of the semiconductor device.

According to another aspect of the present invention, preferably, there is provided a semiconductor device including an electrode pad, a capacitor and a substrate. The substrate has a given area on which the electrode and the capacitor are arranged. The capacitor has a connecting side that connects outer sides of the capacitor crossing at substantially right angles and that faces to an inner corner formed by extensions of the outer sides. The connecting side is concave toward the capacitor. The capacitor and the electrode pad are arranged on the substrate so that the electrode pad faces to the connecting side in a part of an inner area laid out by extensions of the outer sides.

With the above-mentioned configuration, it is possible to enlarge a part of the capacitor adjacent to the electrode pad toward the electrode pad. It is, therefore, possible to enlarge the area of the capacitor. And it is possible to enlarge the capacitance of the capacitor without an enlargement of the semiconductor device.

According to another aspect of the present invention, preferably, there is provided a semiconductor device including an electrode pad, a capacitor and a substrate. The capacitor has a first capacitor area and a second capacitor area. The second capacitor area is arranged on the first capacitor area. The substrate has a given area on which the electrode pad and the capacitor are arranged. The second capacitor area is adjacent to the electrode pad at a given interval. The first capacitor area extends toward the electrode pad compared to the second capacitor area.

With the above-mentioned configuration, it is possible to enlarge the capacitance of the first capacitor area. It is therefore possible to enlarge the capacitance of the capacitor without an enlargement of the semiconductor device.

BRIEF DESCRIPTION OF THE DRAWINGS

Preferred embodiments of the present invention will be described in detail with reference to the following drawings, wherein.

DESCRIPTION OF THE PREFERRED EMBODIMENTS

A description will now be given, with reference to the accompanying drawings, of embodiments of the present invention.

First Embodiment

Figure 1A:
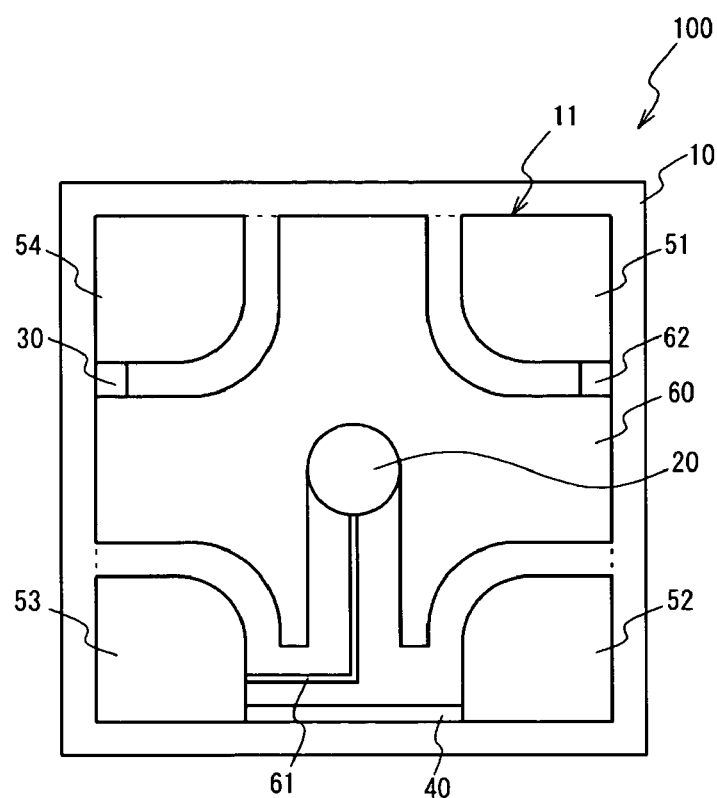
FIG. 1A and FIG. 1B illustrate an optical semiconductor device in accordance with a first embodiment of the present invention.
Figure 1B:
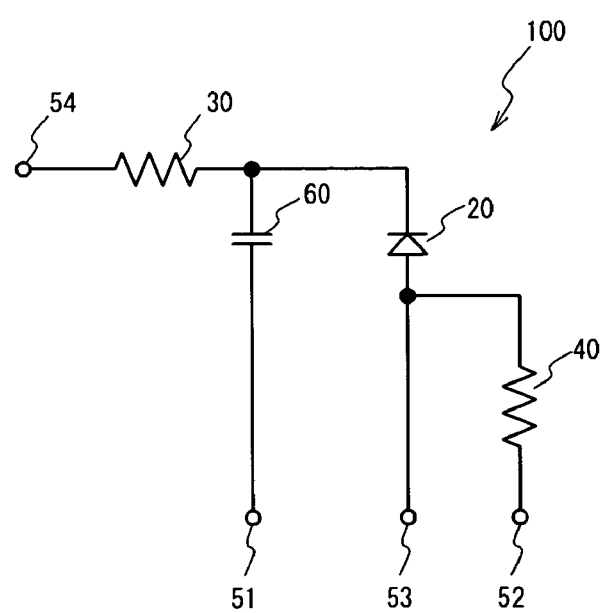

FIG. 1A and FIG. 1B illustrate an optical semiconductor device 100 in accordance with a first embodiment of the present invention. FIG. 1A illustrates a top view of the optical semiconductor device 100. FIG. 1B illustrates a circuit diagram of the optical semiconductor device 100. As shown in FIG. 1A, the optical semiconductor device 100 includes a photodiode 20, resistors 30 and 40, electrode pads 51 through 54 and a capacitor 60 arranged in an arrangement area 11 on a substrate 10.

The substrate 10 is, for example, a square chip approximately 440 µm on a side. The substrate 10 is composed of a semi-insulating material such as InP. The photodiode 20 is a PIN photodiode having a photo acceptance diameter of approximately 30 µm to 100 µm. The photodiode 20 is arranged in a center area on the substrate 10. The photodiode 20 may be an avalanche photodiode (APD).

The resistors 30 and 40 are to reduce a noise such as a reflection wave of a high frequency wave, an overshoot or an undershoot, the noise causing a malfunction of the device. The resistor 30 couples the electrode pad 54 and the capacitor 60. The resistor 40 couples the electrode pad 52 and the electrode pad 53. A resistance of the resistor 30 is, for example, 50 Ω. A resistance of the resistor 40 is, for example, 30 Ω.

Each of the electrode pads 51 through 54 is arranged on each of the corners of the arrangement area 11. The electrode pad 51 is coupled to the capacitor 60 through a wire 62. The photodiode 20 is coupled to the electrode pad 53 through a wire 61. The capacitor 60 is arranged to be adjacent to the electrode pads 51 through 54 at a given interval in the arrangement area 11 except for the areas of the photodiode 20, the resistors 30 and 40 and the wire 61 and 62. The elements and the electrode pads are coupled as mentioned above. And the circuit structure is shown in FIG. 1B.

FIG. 2A through FIG. 2D illustrate a shape detail of the electrode pads 51 through 54 and the capacitor 60. In FIG. 2A through 2D, a description will be given of a shape of the electrode pad 51 and a shape of a part of the capacitor 60 around the electrode pad 51. And the explanation is simplified. The electrode pad 51 is arranged so that two sides thereof are at a corner of the arrangement area 11 and are facing to a corner of the substrate 10.

In the embodiment, the electrode pad 51 is arranged so that a corner 51a thereof is in parallel with a corner of the substrate 10 where the electrode pad 51 is arranged. It is thus possible to maximally enlarge an area of the electrode pad 51 toward the corner where the electrode pad 51 is arranged. Therefore, it is possible to connect a bonding wire to the electrode pad 51 easily. And it is possible to connect the bonding wire to the electrode pad 51 from both directions of the two sides forming the corner 51a. Therefore, a degree of freedom of directions, where the bonding wire is connected to the electrode pad 51, increases. In the embodiment, each of the two sides of the electrode pad 51 forming the corner 51a is approximately 90 µm.

At least a part of the corner opposite to the corner 51a is cut off. That is, the electrode pad 51 has a shape in which an area 51b opposite to the corner 51a contracts toward the corner 51a. In this case, it is possible to enlarge a facing part of the capacitor 60 facing to the electrode pad 51 toward the electrode pad 51. Therefore, the electrode pad 51 has a sufficient area and it is possible to enlarge the area of the capacitor 60. And it is possible to enlarge the area of the capacitor 60, if the capacitor 60 and the electrode pad 51 are adjacent to each other at a given constant interval at an area where the electrode pad 51 and the capacitor 60 are adjacent.

Each of the electrode pads 52 through 54 is arranged at each of other corners of the arrangement area 11, as is in the case of the electrode pad 51. In the embodiment, it is possible to increase a capacitance of the capacitor 60 to approximately 100 pF. A description will be given of examples of the electrode pad 51.

Figure 2A:
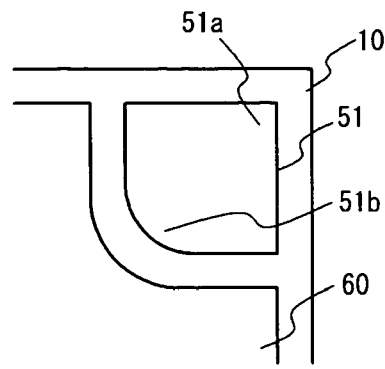
FIG. 2A through FIG. 2D illustrate a shape detail of the electrode pads and the capacitor.
Figure 2B:
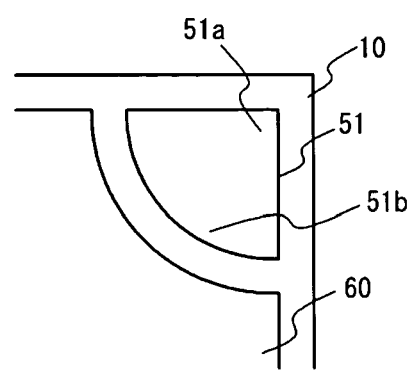

As shown in FIG. 2A, the area 51b may have a rounded shape. In this case, two sides of the capacitor 60 are coupled to each other through a curved side concave toward the capacitor 60, the two sides facing to the electrode pad 51 and crossing at right angles to each other. As shown in FIG. 2B, the area 51b may have a circular arc shape and may have a curved shape so as to project in a direction opposite to the corner 51a. In this case, a circumference of the capacitor 60 facing to the electrode pad 51 is concave toward the capacitor 60.

Figure 2C:
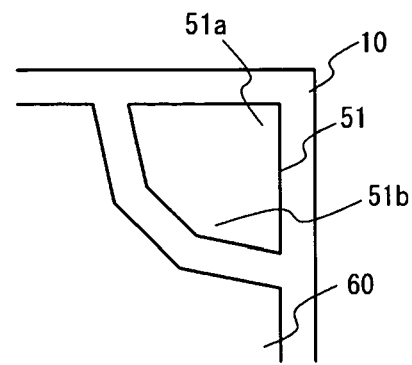
Figure 2D:
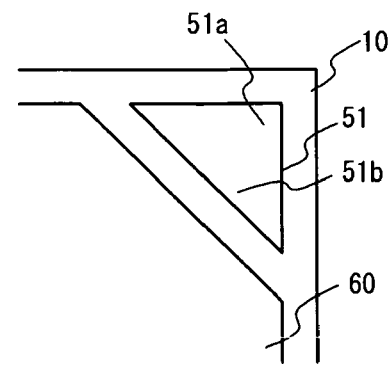

As shown in FIG. 2C, the area 51b may have a polygonal shape and may have a shape in which the area 51b contracts toward the corner 51a. In the case of FIG. 2C, the capacitor 60 and the electrode pad 51 are adjacent to each other so that three successive sides of the electrode pad 51 are adjacent to three successive sides of the capacitor 60 at a given interval. An outside angle of the capacitor 60 between the two of the three sides of the capacitor 60 is more than 90 degrees. As shown in FIG. 2D, the area 51b may have a triangle shape whose area opposite side of the corner 51a is cut off. In this case, the two sides of the capacitor 60 are coupled to each other through a side that forms interior angles more than 90 degrees with the two sides, the two sides forming a corner facing to the electrode pad 51.

When the electrode pad 51 has a shape mentioned above, the electrode pad 51 has a sufficient area where the bonding pad is connected and it is possible to enlarge the capacitance of the capacitor 60 without an enlargement of the optical semiconductor device 100. And it is not necessary to couple the optical semiconductor device 100 to an outside resistor and an outside capacitor. Therefore, a packaging density of the optical semiconductor device 100 is improved.

Figure 3:
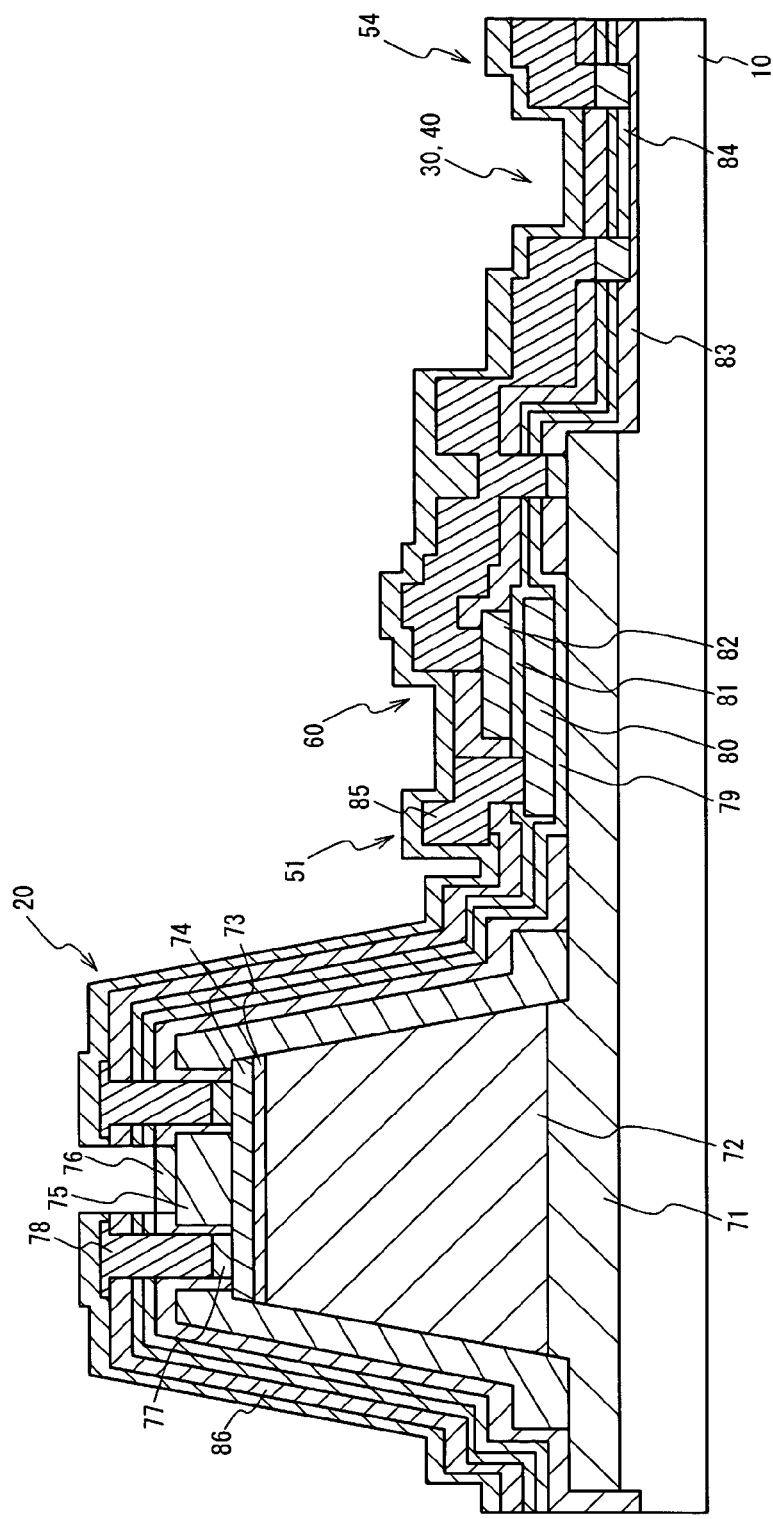
FIG. 3 illustrates a schematic cross-section of an optical semiconductor device.

FIG. 3 illustrates a schematic cross-section of the optical semiconductor device 100. A description will be given of the lamination structure of the optical semiconductor device 100 with reference to FIG. 3. The photodiode 20 has a structure in which an n-type InGaAs layer 71, an i-type InGaAs layer 72, a p-type InGaAs layer 73, a p-type InGaAs layer 74, an i-type InP layer 75 and an antireflecting SiON layer 76 are laminated on the substrate 10 in order. An ohmic electrode 77 and an electrode 78 pass through upward from a part of the p-type InGaAs layer 74.

The thickness of the n-type InGaAs layer 71 is approximately 600 nm. The thickness of the i-type InGaAs layer 72 is approximately 2,700 nm. The thickness of the p-type InGaAs layer 73 is 100 nm. The thickness of the p-type InGaAs layer 74 is approximately 200 nm. The thickness of the i-type InP layer 75 is approximately 500 nm. The thickness of the antireflecting SiON layer 76 is approximately 200 nm.

The capacitor 60 has a structure in which a SiN layer 79, a metal layer 80, a SiN layer 81 and a metal layer 82 are laminated on the n-type InGaAs layer 71 in order, the metal layer 80 being composed of 100 nm Ti/80 nm Pt/130 nm Au, the metal layer 82 being composed of 100 nm Ti/80 nm Pt/130 nm Au. That is, the capacitor 60 has a structure in which a Metal-Insulator-Semiconductor (MIS) capacitor and a Metal-Insulator Metal (MIM) capacitor are stacked. The thickness of the SiN layers 79 and 81 is approximately 70 nm.

As mentioned above, a part of the n-type InGaAs layer 71 is an n-type semiconductor layer of the photodiode 20 and another part of the n-type InGaAs layer 71 is a semiconductor layer of the capacitor 60. In this case, it is possible to form the n-type semiconductor layer of the photodiode 20 and the semiconductor layer of the capacitor 60 in a same process. It is thus possible to reduce the manufacturing cost of the optical semiconductor device 100. And it is possible to downsize the optical semiconductor device 100, compared to a case where the n-type semiconductor layer of the photodiode 20 and the semiconductor layer of the capacitor 60 are formed separately.

The p-type semiconductor layer of the photodiode 20 and the semiconductor layer of the capacitor 60 may be a part of a semiconductor layer. In a case where an avalanche photodiode is used as the photodiode 20, a semiconductor layer of the avalanche photodiode and the semiconductor layer of the capacitor 60 may be a part of a semiconductor layer.

The resistors 30 and 40 have a structure in which a SiN layer 83 and a resistor layer 84 composed of NiCrSi are laminated on the substrate 10. The antireflecting SiON layer 76 covers whole of a face of the optical semiconductor device 100. The electrode pad 51 is an electrode 85 composed of Ti/Pt/Au laminated on a part of the metal layer 80. A SiON layer 86 for contacting is provided between the SiN layer 81 and the antireflecting SiON layer 76. The thickness of the SiON layer 86 is approximately 170 nm.

Next, a description will be given of a method of manufacturing the optical semiconductor device 100. An n-type InGaAs layer including Si of $1\times10^{18}$ cm$^{-3}$, an i-type InGaAs layer not including impurities on purpose, a p-type InGaAs layer including Zn of $1\times10^{18}$ cm$^{-3}$ and a p-type InGaAs layer including Zn of $1.5\times10^{19}$ cm$^{-3}$ are laminated on the substrate 10 in order. These layers are formed by a method of such as Metal Organic Vapor Phase Epitaxy (MOVPE).

Next, these layers above are eliminated except for an area of the i-type InGaAs layer 72, the p-type InGaAs layer 73 and the p-type InGaAs layer 74 where the photodiode 20 is to be formed and an area of the n-type InGaAs layer 71 where the photodiode 20 and the capacitor 60 are to be formed, by an etching process using a sulfuric acid. Then, the i-type InP layer 75 is grown so as to cover the i-type InGaAs layer 72, the p-type InGaAs layer 73 and the p-type InGaAs layer 74.

Next, an area of the n-type InGaAs layer and a part of the substrate where the resistors 30 and 40 are to be formed are eliminated by a phosphoric acid etching process and an acetic acid etching process. After that, a layer forming process and an etching process are repeated. And the SiN layer 83, the ohmic electrode 77, the SiN layer 79, the resistor layer 84, the metal layer 80, the SiN layer 81, the metal layer 82, the SiON layer 86 for contacting, the electrode 85 and the antireflecting SiON layer 76 are formed in order. With the processes above, the optical semiconductor device 100 is manufactured.

Figure 4A:
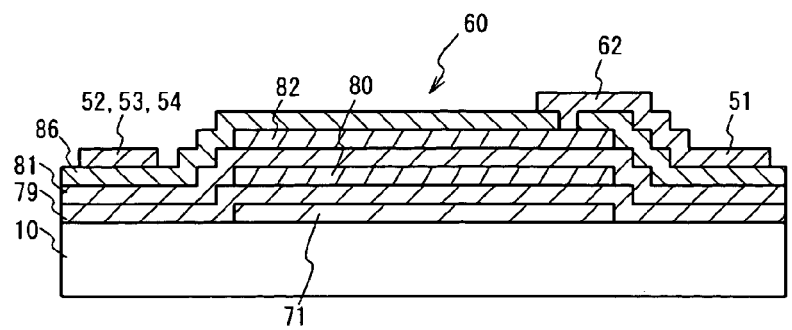
FIG. 4A through FIG. 4D illustrate a sectional view for giving an explanation of an example of a dimensional relationship between electrode pads and a capacitor in an optical semiconductor device.
Figure 4B:
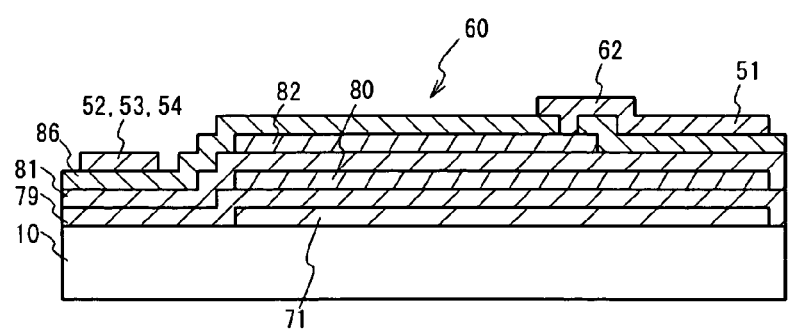

FIG. 4A through FIG. 4D illustrate a sectional view for giving an explanation of an example of a dimensional relationship between the electrode pads 51 through 54 and the capacitor 60 in the optical semiconductor device 100. As shown in FIG. 4A, the capacitor 60 may not be provided under the electrode pads 51 through 54. In this case, it is possible to degrade an effect from the electrode pads 51 through 54 to the capacitor 60. The electrode pad 51 and the capacitor 60 are coupled because of a coupling of the electrode pad 51 and the metal layer 82 through the wire 62. As shown in FIG. 4B, the n-type InGaAs layer 71, the SiN layer 79 and the metal layer 80 may extend to below the electrode pad 51. In this case, the capacitance of the MIS capacitor included in the capacitor 60 increases. It is, therefore, possible to increase the capacitance of the capacitor 60.

Figure 4C:
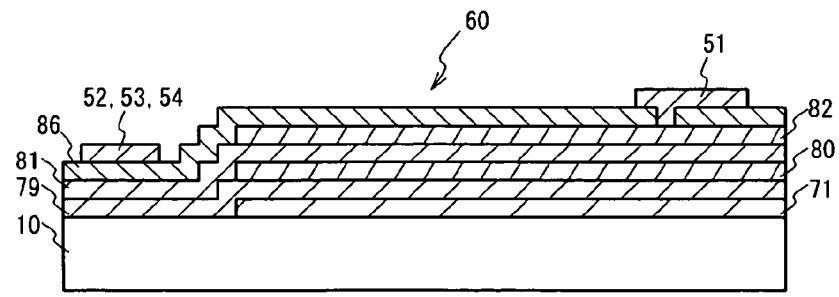

As shown in FIG. 4C, the n-type InGaAs layer 71, the SiN layer 79, the metal layer 80, the SiN layer 81 and the metal layer 82 may extend to below the electrode pad 51. In this case, the capacitance of the MIS capacitor and the MIM capacitor included in the capacitor 60 increases. It is, therefore, possible to increase the capacitance of the capacitor 60.

Figure 4D:
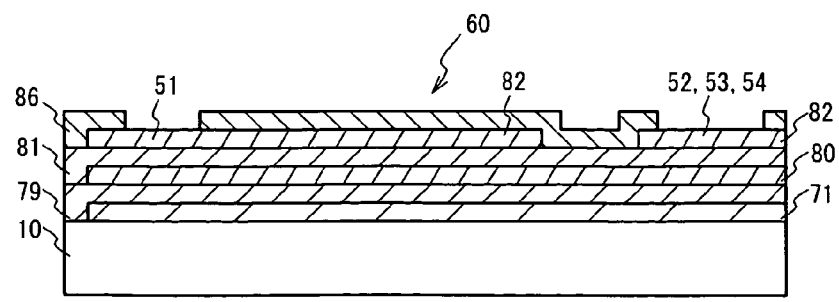

As shown in FIG. 4D, separated parts of the metal layer 82 may be used for the electrode pads 52 through 54 and a part of the metal layer 82 may be used for the electrode pad 51. The n-type InGaAs layer 71, the SiN layer 79 and the metal layer 80 may extend to below the electrode pads 52 through 54.

In this case, it is possible to form the electrode pads 51 through 54 at a time in a forming process of the metal layer 82. Therefore, it is possible to shorten the manufacturing process of the optical semiconductor device 100. And it is possible to reduce the manufacturing cost of the optical semiconductor device 100. On the electrode pad 51 side, the capacitance of the MIS capacitor and the MIM capacitor included in the capacitor 60 increases. On the electrode pads 52 through 54 sides, the capacitance of the MIS capacitor included in the capacitor 60 increases. It is, therefore, possible to increase the capacitance of the capacitor 60.

Figure 5:
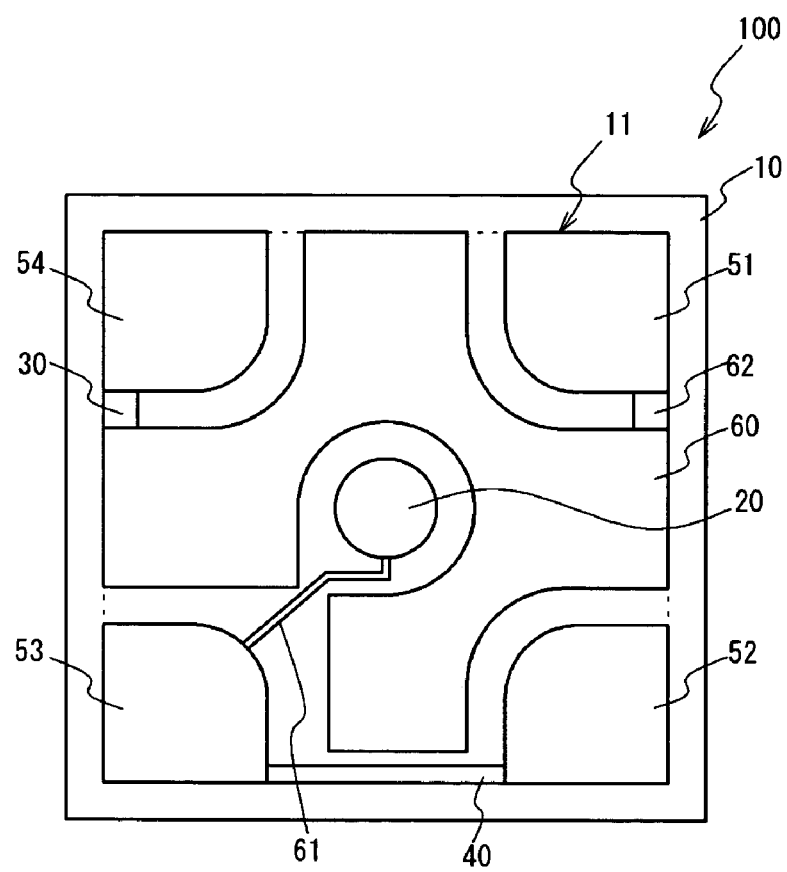
FIG. 5 illustrates another layout of an optical semiconductor device.

FIG. 5 illustrates another layout of the optical semiconductor device 100. As shown in FIG. 5, the wire 61 may be arranged along a shortest line between the electrode pad 53 and the photodiode 20. In this case, it is possible to maximally use an area of the substrate 10 except for the photodiode 20, the resistors 30 and 40 and the wires 61 and 62, and is possible to enlarge the area of the capacitor 60.

In the embodiment, the MIS capacitor of the capacitor 60 corresponds to the first capacitor area. The MIM capacitor of the capacitor 60 corresponds to the second capacitor area. The photodiode 20 corresponds to the light-receiving element.

Second Embodiment

Figure 6A:
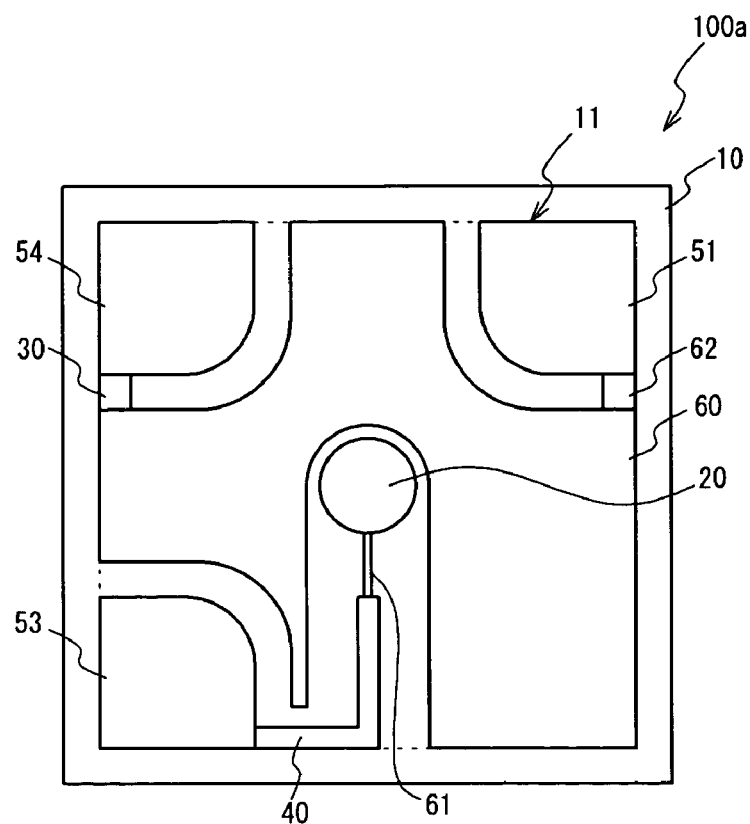
FIG. 6A and FIG. 6B illustrate an optical semiconductor device in accordance with a second embodiment of the present invention.
Figure 6B:
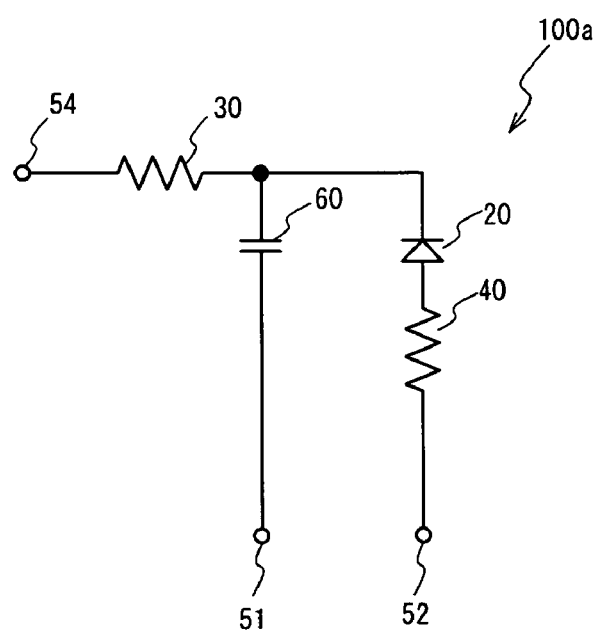

FIG. 6A and FIG. 6B illustrate an optical semiconductor device 100a in accordance with a second embodiment of the present invention. FIG. 6A illustrates a top view of the optical semiconductor device 100a. FIG. 6B illustrates a circuit diagram of the optical semiconductor device 100a. As shown in FIG. 6A, in the optical semiconductor device 100a, the electrode pad 52 is not provided and the area of the capacitor 60 is enlarged.

As shown in FIG. 6A, the electrode pad 53 and the photodiode 20 are coupled to each other through the resistor 40 and the wire 61. The capacitor 60 occupies the area where the electrode pad 52 is arranged in the optical semiconductor device 100. Therefore, it is possible to maximally use an area of the substrate 10 and is possible to enlarge the capacitor 60. In the embodiment, the capacitance of the capacitor 60 is approximately 123 pF. The elements and the electrode pads are coupled as mentioned above. And the circuit structure is shown in FIG. 6B.

In a case where there are provided three electrode pads, it is possible to enlarge the area of the capacitor 60 when the electrode pads 51, 53 and 54 have a shape shown in FIG. 2A through FIG. 2D. Accordingly, it is possible to enlarge the capacitance of the capacitor 60 without an enlargement of the optical semiconductor device 100a.

Third Embodiment

Figure 7:
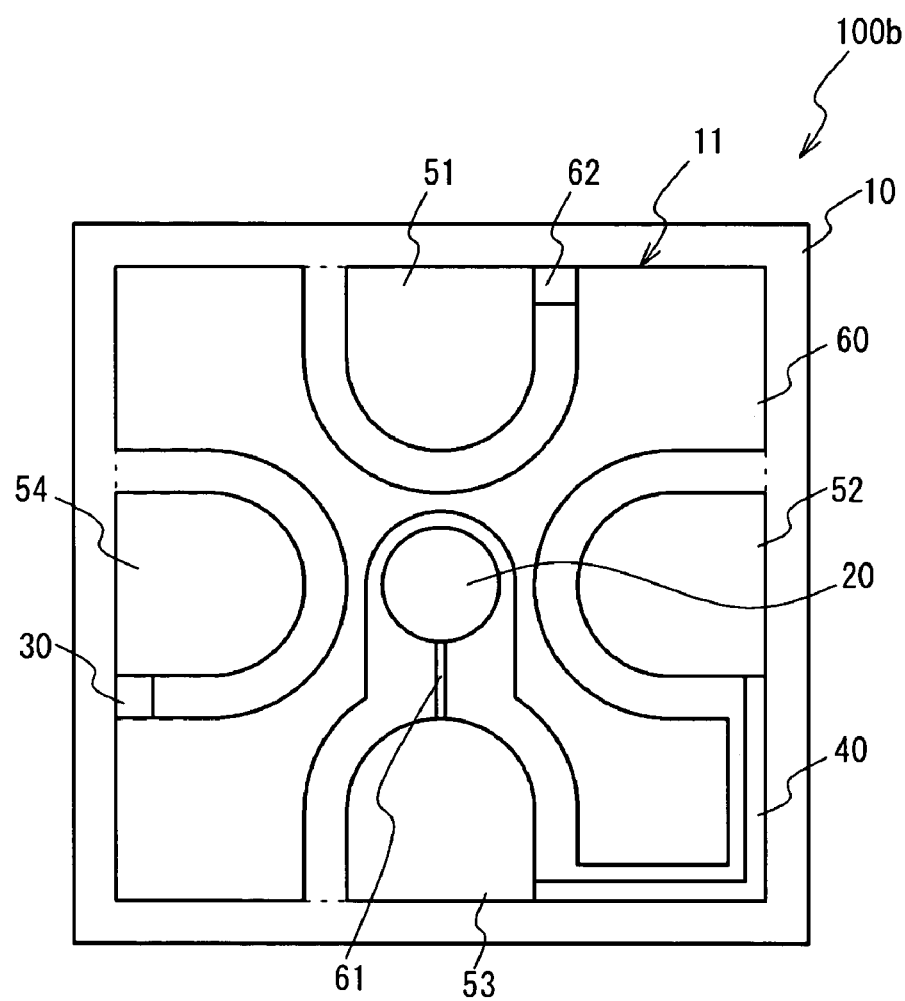
FIG. 7 illustrates a top view of an optical semiconductor device in accordance with a third embodiment.

Next, a description will be given of an optical semiconductor device 100b in accordance with a third embodiment of the present invention. FIG. 7 illustrates a top view of the optical semiconductor device 100b. As shown in FIG. 7, the optical semiconductor device 100b is different from the optical semiconductor device 100 in an arrangement and a shape of the electrode pads 51 through 54. Each of the electrode pads 51 through 54 is arranged at a center area of each sides of the arrangement area 11. The elements and the electrode pads are coupled to each other, similarly to the case of the optical semiconductor device 100. The capacitor 60 is arranged adjacent to the electrode pads 51 through 54 at a given interval, in the arrangement area 11 except for the photodiode 20, the resistors 30 and 40 and the wires 61 and 62.

Figure 8A:
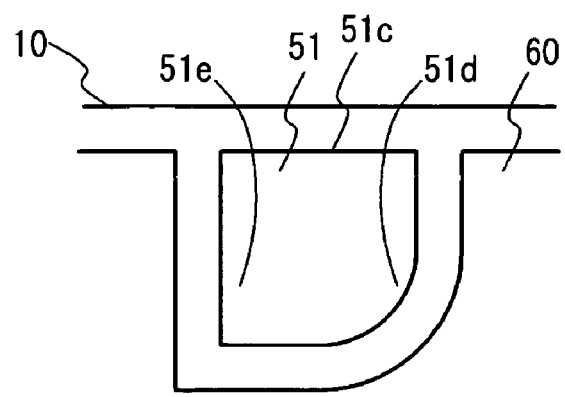
FIG. 8A through FIG. 8C illustrate a shape detail of electrode pads and a capacitor.
Figure 8B:
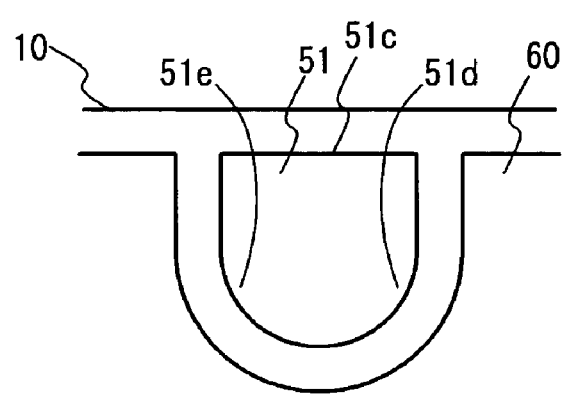
Figure 8C:
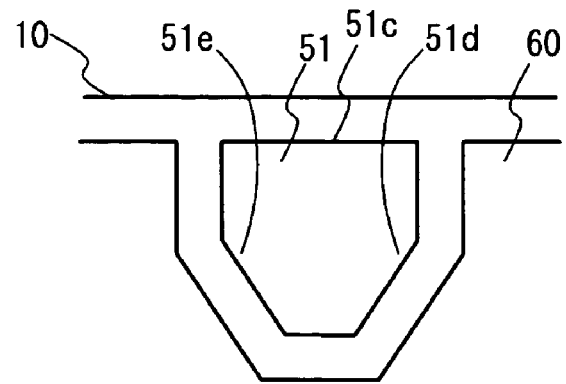

FIG. 8A through FIG. 8C illustrate a shape detail of the electrode pads 51 through 54 and the capacitor 60. In FIG. 8A through FIG. 8C, a description will be given of a shape of the electrode pad 51 and a shape of a part of the capacitor 60 around the electrode pad 51. And the explanation is simplified. The electrode pad 51 is arranged so that a side thereof is facing to a side of the substrate 10 at the side part of the arrangement area 11. In the embodiment, the electrode pad 51 is arranged so that a side 51c of the electrode pad 51 is parallel with a side of the substrate 10 on which the electrode pad 51 is arranged. It is, therefore, possible to maximally enlarge the area of the electrode pad 51 toward the side of the substrate 10 where the electrode pad 51 is arranged. Accordingly, it is possible to connect a bonding wire to the electrode pad 51 easily. In the embodiment, the length of the side 51c is approximately 90 μm.

Here, in the electrode pad 51, two corner areas opposite to the side 51c are referred to an area 51d and an area 51e respectively. The area of the electrode pad 51 opposite to the side 51c has a rectangular shape whose at least a part of one corner opposite to the side 51c is cut off. That is, at least one of the area 51d and the area 51e contracts toward inner side of the electrode pad 51. In this case, it is possible to enlarge a facing part of the capacitor 60 facing to the electrode pad 51 toward the electrode pad 51. Therefore, the electrode pad 51 has a sufficient area and it is possible to enlarge the area of the capacitor 60.

The electrode pads 52 through 54 are arranged at each of other sides of the arrangement area 11, similarly to the electrode pad 51. The electrode pads 52 through 54 have a same shape as the electrode pad 51. In the embodiment, it is possible to increase the capacitance of the capacitor 60 to 125 pF. Examples of the electrode pad 51 are described below.

As shown in FIG. 8A, the area 51d and the area 51e may have a rounded shape. As shown in FIG. 8B, both of the areas 51d and 51e may have a circular arc shape and may have a curved shape so as to project in a direction opposite to the side 51c. As shown in FIG. 8C, the area 51d and the area 5e may have a rectangular shape of which corner is cut off. When the electrode pad 51 has a shape mentioned above, the electrode pad 51 has a sufficient area where the bonding pad is connected and it is possible to enlarge the capacitance of the capacitor 60 without an enlargement of the optical semiconductor device 100b. And it is not necessary to couple the optical semiconductor device 100b to an outside resistor and an outside capacitor. Therefore, a packaging density of the optical semiconductor device 100b is improved.

In the embodiment, the MIS capacitor and the MIM capacitor of the capacitor 60 may extend to below the electrode pad 51, and the MIS capacitor of the capacitor 60 may extend to below the electrode pads 52 through 54.

Fourth Embodiment

Figure 9:
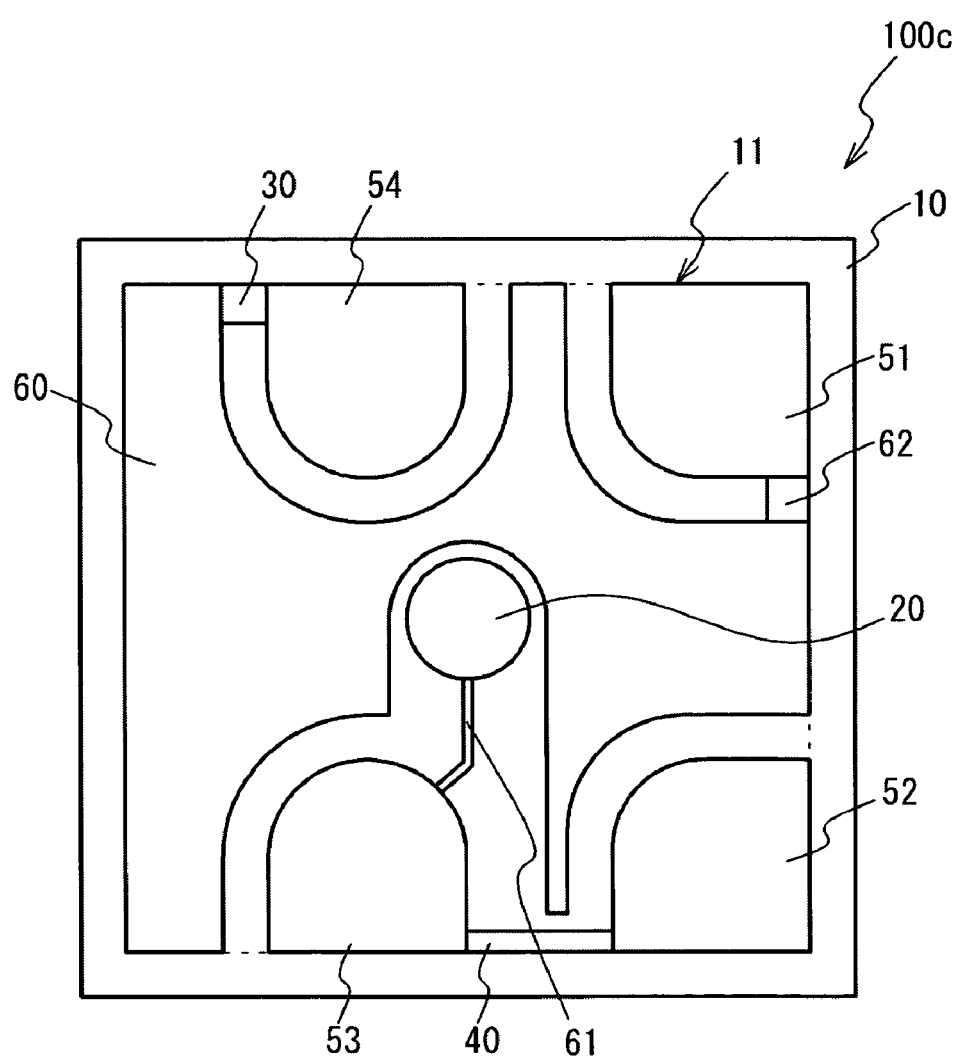
FIG. 9 illustrates a top view of an optical semiconductor device in accordance with a fourth embodiment of the present invention.

FIG. 9 illustrates a top view of an optical semiconductor device 100c in accordance with a fourth embodiment of the present invention. As mentioned above, in the first and the second embodiment, each of the electrode pads is arranged at each of the corners of the arrangement area 11. In the third embodiment, each of the electrode pads is arranged at each of the sides of the arrangement area 11. In the fourth embodiment, at least one of the electrode pads is arranged at the corner of the arrangement area 11, and at least one of the electrode pads is arranged at the side of the arrangement area 11. The details are mentioned below.

As shown in FIG. 9, the optical semiconductor device 100c is different from the optical semiconductor device 100 in the arrangement of the electrode pads 53 and 54. In the optical semiconductor device 100c, the electrode pad 53 is arranged at the side of the arrangement area 11 on the electrode pad 52 side relative to the corner where the electrode pad 53 is arranged in FIG. 1. The electrode pad 54 is arranged at the side of the arrangement area 11 on the electrode pad 51 side relative to the corner where the electrode pad 54 is arranged in FIG. 1. Each of the elements is coupled to each of the electrode pads, as in the case of the optical semiconductor device 100. The capacitor 60 is arranged adjacent to the electrode pads 51 through 54 on the substrate 10 at a given distance on the substrate 10 except for the area where the photodiode 20, the resistors 30 and 40, and the wire 61 are arranged.

As mentioned above, it is possible to enlarge the area of the capacitor 60 if the electrode pads 51 through 54 have a shape shown in FIG. 2A through FIG. 2D or FIG. 8A through FIG. 8C, in the case where each of the electrode pads is arranged at the corner and the side of the substrate 10. Therefore, the electrode pads 51 through 54 have a sufficient area where the bonding pad is connected and it is possible to enlarge the capacitance of the capacitor 60 without an enlargement of the optical semiconductor device 100*c*. Each of the electrode pads 51 through 54 may be arranged at each of the corners and sides of the arrangement area 11.

In the embodiment, the MIS capacitor and the MIM capacitor of the capacitor 60 may extend to below the electrode pad 51, and the MIS capacitor of the capacitor 60 may extend to below the electrode pads 52 through 54.

Fifth Embodiment

Figure 10A:
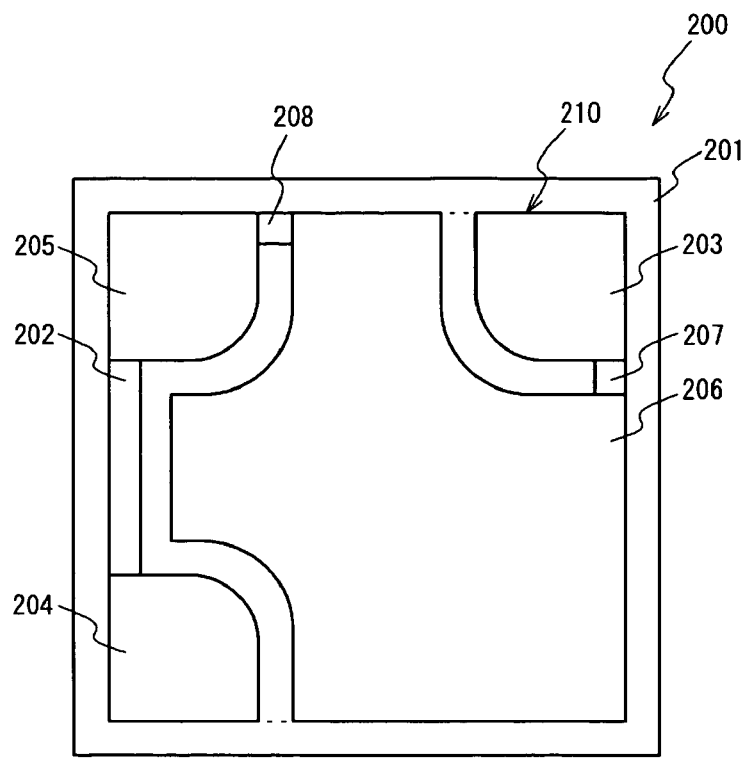
FIG. 10A and FIG. 10B illustrate an electronic device in accordance with a fifth embodiment.
Figure 10B:
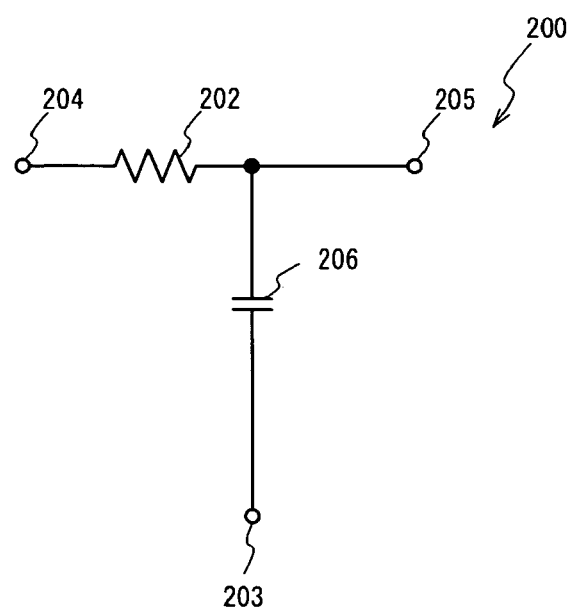

Next, a description will be given of an electronic device 200 in accordance with a fifth embodiment of the present invention. FIG. 10A and FIG. 10B illustrate the electronic device 200. FIG. 10A illustrates a top view of the electronic device 200. FIG. 10B illustrates a circuit diagram of the electronic device 200. As shown in FIG. 10A, the electronic device 200 has a structure in which a resistor 202, electrode pads 203 through 205 and a capacitor 206 are arranged in an arrangement area 210 on a substrate 201.

The substrate 201 is composed of a same material and has a same shape as the substrate 10. The resistor 202 couples the electrode pad 204 and the electrode pad 205. The resistance of the resistor 202 is, for example, approximately 50Ω. Each of the electrode pads 203 through 205 is arranged at each of the corners of the arrangement area 210. A wire 207 couples the electrode pad 203 and the capacitor 206. A wire 208 couples the electrode pad 205 and the capacitor 206.

The capacitor 206 is arranged to be adjacent to the electrode pads 203 through 205 at a given interval in the arrangement area 210 except for the areas of the resistor 202, the electrode pads 203 through 205 and the wires 207 and 208. The elements and the electrode pads are coupled as mentioned above. And the circuit structure is shown in FIG. 10B. A lamination structure of the electronic device 200 is as same as that of the optical semiconductor device 100 in a case where the photodiode is not provided.

The electrode pads 203 through 205 have a shape shown in FIG. 2A through 2D. It is, therefore, possible to enlarge the area of the capacitor 206. And the capacitor 206 has a sufficient area where the bonding pad is connected and it is possible to enlarge the capacitance of the capacitor 60 without an enlargement of the electronic device 200. And it is not necessary to couple the electronic device 200 to an outside resistor and an outside capacitor. Therefore, a packaging density of the electronic device 200 is improved.

The electrode pads 203 through 205 may be arranged at sides of the arrangement area 210 and may have a shape shown in FIG. 8A through FIG. 8C. An arrangement relationship between the capacitor and the electrode pads on a plane is not limited to the embodiments above. In this case, the capacitor and the electrode pads may have a shape shown in FIG. 2A through FIG. 2D and FIG. 8A through FIG. 8C. In the embodiment, the MIS capacitor and the MIM capacitor of the capacitor 206 may extend to below the electrode pad 203, and the MIS capacitor of the capacitor 206 may extend to below the electrode pads 204 and 205.

While the above description constitutes the preferred embodiments of the present invention, it will be appreciated that the invention is susceptible of modification, variation and change without departing from the proper scope and fair meaning of the accompanying claims.

The present invention is based on Japanese Patent Application No. 2005-379661 filed on Dec. 28, 2005, the entire disclosure of which is hereby incorporated by reference.

What is claimed is:

1. A semiconductor device comprising:
    an electrode pad;
    a capacitor; and
    a substrate having a given area on which the electrode pad and the capacitor are arranged,
    the electrode pad and the capacitor being arranged on the substrate so that each of at least two sides of the capacitor and each of at least two sides of the electrode pad is adjacent to each other at a given interval,
    the capacitor having a connecting side that connects the two sides of the capacitor and that faces to an inner corner formed by extensions of outer sides of the capacitor crossing at substantially right angles,
    the connecting side being concave toward the capacitor.

2. The semiconductor device as claimed in claim 1, wherein the capacitor has a MIS structure or a MIM structure.

3. The semiconductor device as claimed in claim 1, wherein:
    the capacitor has a first capacitor area and a second capacitor area,
    the second capacitor area being arranged on the first capacitor area; and
    the first capacitor area extends toward the electrode pad compared to the second capacitor area.

4. The semiconductor device as claimed in claim 1 further comprising a light-receiving element,
    wherein:
    an acceptance face of the light-receiving element is arranged in a center area of the substrate; and
    the electrode pad is arranged at one of four corners of the substrate.

5. The semiconductor device as claimed in claim 4, wherein the light-receiving element is an avalanche photodiode or a PIN photodiode.

6. The semiconductor device as claimed in claim 1 further comprising a resistor provided on the substrate.

* * * * *